United States Patent [19]

Hoyt

[11] Patent Number: 4,862,752
[45] Date of Patent: Sep. 5, 1989

[54] D.C. EXCITED CAPACITIVE SHAFT ROTATION TRANSDUCER

[75] Inventor: Charles D. Hoyt, Northglenn, Colo.

[73] Assignee: Ferrotec, Inc., Broomfield, Colo.

[21] Appl. No.: 865,272

[22] Filed: May 21, 1986

[51] Int. Cl.[4] .......................... G01L 3/10; G08C 19/16
[52] U.S. Cl. .............................. 73/862.34; 340/870.37; 361/298
[58] Field of Search ...................... 73/862.34; 361/278, 361/280, 298; 340/870.37

[56] References Cited

U.S. PATENT DOCUMENTS

| | | | |
|---|---|---|---|
| 3,121,839 | 2/1964 | Malenick et al. | 340/870.37 |
| 3,219,920 | 11/1965 | Wall . | |
| 3,487,402 | 12/1969 | Hillhouse . | |
| 3,702,467 | 11/1972 | Melnyk . | |
| 3,961,318 | 6/1976 | Farrand et al. . | |
| 4,040,041 | 8/1977 | Fletcher et al. . | |
| 4,122,708 | 10/1978 | Maier . | |
| 4,418,348 | 11/1983 | Tanaka et al. | 340/870.37 |
| 4,550,618 | 11/1985 | Kohama et al. . | |

FOREIGN PATENT DOCUMENTS 283637 10/1970 U.S.S.R. .......................... 73/862.34

Primary Examiner—Charles A. Ruehl
Attorney, Agent, or Firm—Sixbey, Friedman, Leedom & Ferguson

[57] ABSTRACT

A capacitive transducer for measuring the rotation of a shaft including relatively movable rotor and stator elements. A unique arrangement of capacitive plates is mounted on the stator and rotor for producing a signal indicative of shaft rotation using direct current excitation but without requiring brushes, commutators or slip rings. A preferred embodiment may further include co-planar first, second and third stator plates or alternatively, cylindrically shaped stator and rotor plates. The number of stator plate segments included in each of the first and second stator plates, of the embodiment employing co-planar plates, may be an even multiple less than the number of rotor plate segments. By this arrangement, a circumferential gap may be provided in the first and second plates through which an extension of the third stator plate may be located to reach an output signal terminal located adjacent to but beyond the radial extent of the first and second stator plates.

14 Claims, 6 Drawing Sheets

REAR SENSOR (REFERENCE)

REAR SENSOR (REFERENCE)

PHASE DIFFERENCE (LOW POSITIVE TORQUE)
FRONT SENSOR

PHASE DIFFERENCE (HIGH POSITIVE TORQUE)
FRONT SENSOR

PHASE DIFFERENCE (LOW NEGATIVE TORQUE)
FRONT SENSOR

PHASE DIFFERENCE (HIGH NEGATIVE TORQUE)
FRONT SENSOR

D.C. EXCITED CAPACITIVE SHAFT ROTATION TRANSDUCER

DESCRIPTION

1. Technical Field

The present invention relates to capacitive transducers for measuring the rotation of a shaft including relatively movable rotor and stator elements.

2. Background Art

The desirability of employing capacitively coupled elements in shaft rotation sensors has long been recognized as is illustrated in U.S. Pat. No. 3,961,318 wherein the advantages of capacitive coupling versus magnetic coupling to achieve increased precision and low cost is discussed. Typically, such devices include two relatively movable elements each of which has a surface in spaced opposition to a surface of the other. Sets of arranged electrodes are mounted on the opposed surfaces and are capacitively coupled such that relative rotation of the elements creates an output electrical signal indicative of the relative movement of the elements.

However, serious difficulties have been encountered with such devices of the prior art. For example, spurious electrostatic coupling between input and output electrodes has resulted in the use of specialized shielding as described in U.S. Pat. No. 3,219,920 to Wall.

Other attempts to perfect capacitive rotation sensors has centered on the desirability of eliminating all direct electrical connections, such as commutators or slip rings, between the output circuitry and the rotor to thereby eliminate the electrical noise inherent in the use of such connections. One example of this type of transducer is disclosed in U.S. Pat. No. 3,702,467 to Melnyk. However, the system disclosed in this patent includes an AC excitation power supply and specialized output circuitry which must be adapted to handle the AC component introduced by the power supply. While suitable for many purposes, an AC power supply is not always available, as in a vehicle where a pair of shaft rotation sensors can be used to measure the torque output of an engine or transmission. Such an arrangement is disclosed in U.S. Pat. No. 3,487,402 to Hillhouse.

Prior art examples of capacitive shaft rotation sensors are known which use a direct current excitation. An example of this is disclosed in U.S. Pat. No. 4,040,041 to Fletcher et. al. but, such sensors often require a direct electrical connection to the rotating shaft or rotor of the sensor.

Still another disadvantage of known shaft rotation sensors is the requirement for complex terminal connections between the stator plate electrodes and the accompanying excitation power supply and output signal circuitry. Note, for example, the need for nine separate external circuit connections with the array of stator plates shown in FIG. 3 of U.S. Pat. No. 3,961,318.

Typical signal processing circuitry for use with shaft rotation sensors is illustrated in U.S. Pat. Nos. 4,550,618 to Kohama et al and 4,122,708 to Mainen, but these patents do not teach how to form an ideal capacitive rotation sensor requiring only D.C. excitation and no direct electrical connection with the rotor. Moreover, these patents do not teach an arrangement of terminal connections between the stator and external circuitry which is simple and easily accessible.

DISCLOSURE OF THE INVENTION

It is an object of the present invention to provide a capacitive shaft transducer which overcomes the deficiencies of the prior art as discussed above by providing a transducer design which may be excited by direct current voltage while at the same time eliminating the need for any direct electrical connection with the movable elements of the transducer.

Another object of this invention is to provide a capacitive transducer employing an arrangement of electrical plates which arrangement is designed to reduce spurious electrical interference and inaccuracies due to transducer misalignment or stray electrostatic coupling.

Still another object of the subject invention is to provide a capacitive transducer for shaft rotation sensing adapted for use with an amplifier circuit whose purpose it is to provide a high impedance load to the variable capacitor as well as pulse shaping and squaring for better definition of the peak and zero crossing points for more precise measurement.

A more detailed object of the subject invention is the provision of a capacitive shaft rotation transducer wherein the entire plate area of the variable capacitor rotating members is utilized for every signal transition, thereby averaging conductor placement and shape irregularities.

Yet another object of the subject invention is to provide a capacitive transducer for shaft rotation sensing wherein the arrangement of terminal connections between the stator plate electrodes and the accompanying excitation and output circuitry has been greatly simplified in comparison to known prior art terminal arrangements used with high precision transducers.

The above objects as well as other objects and advantages are achieved in one embodiment including a stator adapted to be fixedly mounted adjacent to a shaft and a rotor adapted to be mounted on the shaft for rotation with the shaft in a position adjacent the stator. A unique arrangement of capacitive plates is mounted on the stator and rotor for producing a signal indicative of shaft rotation using direct current excitation but without using brushes, commutators or slip rings. The capacitive plates are combined with an arrangement of three adjacent terminals mounted on the stator including two DC voltage supply terminals and an output terminal. The stator is provided with first, second and third plates wherein the first and second plates have interleaved stator plate segments arrangements in a predetermined spaced apart pattern while the third stator plate may be connected with the output signal processing circuitry. An additional plate is mounted on the rotor having a plurality of electrically interconnected rotor plate segments located in a spaced apart pattern and adapted to be alternately capacitively coupled with the first and second sets of stator plate segments as the shaft is rotated. The rotor plate is further provided with a signal transfer segment electrically connected with the rotor plate segments and capacitively coupled with the third stator plate to cause a time variable signal indicative of shaft rotation to appear at the output signal terminal.

A preferred embodiment may further include co-planar first, second and third stator plates or alternatively, cylindrically shaped stator and rotor plates. The number of stator plate segments included in each of the first and second stator plates, of the embodiment employing co-planar plates, may be an even multiple less than the number of rotor plate segments. By this arrangement, a circumferential gap may be provided in the first and second plates through which an extension of the third stator plate may be located to reach an output signal terminal located adjacent to but beyond the radial extent of the first and second stator plates. This arrangement further permits positioning of all necessary stator terminals adjacent one another.

Still other and more specific objects of the present invention may be understood from a consideration of the following Brief Description of the Drawings and Best Mode for Carrying Out the Invention.

BEST MODE FOR CARRYING OUT THE INVENTION

Figure 1:
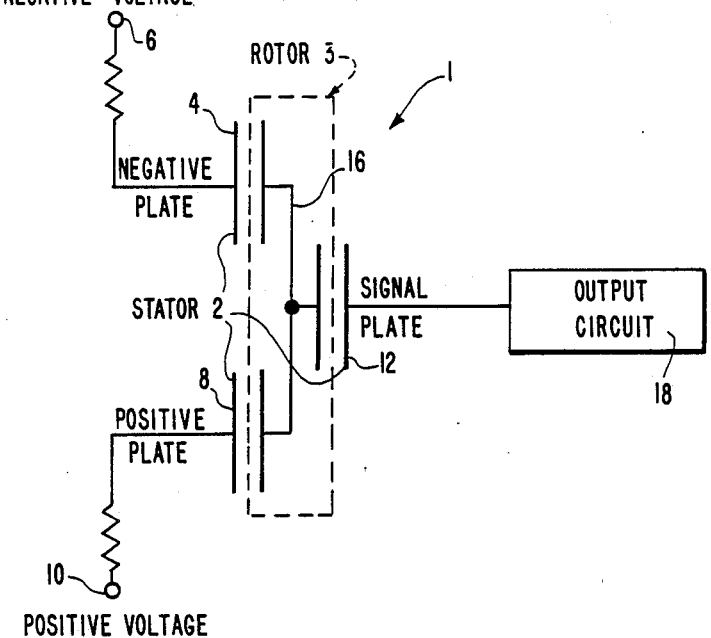
FIG. 1 is a schematic illustration of a capacitive transducer designed in accordance with the subject invention.

FIG. 1 is a highly schematic illustration of a capacitive transducer 1 designed in accordance with the subject invention. The primary elements forming the capacitive transducer illustrated in FIG. 1 include a stationary element or stator 2 and a relatively movable element or rotor 3. Mounted on stator 2 is an array of capacitive plate elements. These elements include a pair of conductive plates having interleaved elements consisting of a first stator plate 4 adapted to be connected with a fixed negative voltage supply 6 and a second stator plate 8 adapted to be connected with a second positive voltage supply 10.

Electrically isolated from first and second stator plates 4 and 8 is a third stator plate 12, the function of which is to produce a time variable signal indicative of the relative movement of rotor 3. Rotor 3 is adapted to be mounted on a rotatable shaft (not illustrated in FIG. 1) in a position adjacent to stator 2. Mounted on rotor 3 is a conductive rotor plate 16 having segments which are alternatively capacitively coupled to the first and second stator plates as the rotor 3 is moved relative to stator 2.

It is important to recognize that the external electrical connections with the capacitive transducer of FIG. 1, are all limited to the stator 2 thereby requiring no brush, commutator or slip ring connection with rotor 3. The output signal from the third stator plate 12 may be connected to an output circuit 18 which may take a variety of forms dependent upon the overall purpose which the capacitive transducer is designed to serve. For example, output circuit 18 may be designed to provide an electrical signal indicative of rotational displacement, or rotational velocity or even the direction of rotational movement. An example of suitable circuit will be discussed hereinafter.

It should also be noted that the capacitive transducer of FIG. 1 utilizes DC voltage excitation thereby eliminating the necessity of providing an AC power source as is required by many prior art capacitive transducers. The manner by which the capacitive transducer of FIG. 1 is capable of producing a highly precise rotational signal using DC excitation without the use of direct electrical connections with rotor 3 will now be explained in greater detail.

Figure 2:
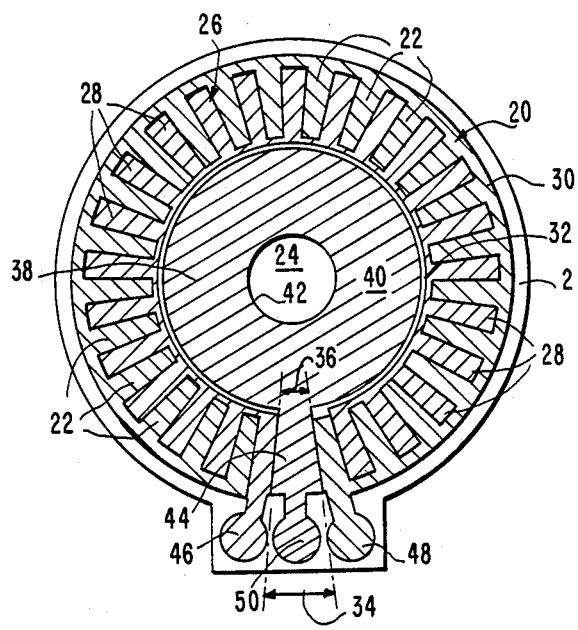
FIG. 2 is an elevational view of the first, second and third plates mounted on the stator of the transducer illustrated in FIG. 1.

In FIG. 2, the configuration and relative positioning of the capacitive plates on stator 2 is illustrated. In particular, FIG. 2 shows a first stator plate 20 mounted on stator 2 including a first set of electrically interconnected stator plate segments 22 located in a predetermined spaced apart pattern. The segments are finger-like in shape and are arranged in a radial orientation around the central axis 24 of stator 2. As illustrated in FIG. 2, stator 2 is generally circular in shape having one face perpendicular to the central axis 24 upon which the first stator plate 20 is mounted. A second stator plate 26 is also mounted on the same face of stator 2. The second stator plate 26 includes a second set of electrically interconnected stator plate segments 28 interleaved with and electrically isolated from said first set of electrical interconnected stator plate segments 22. Like segments 22, the second set of stator plate segments 28 are finger shaped and positioned in a radial orientation with respect to the central axis 24 of stator 2.

The first set of stator plate segments 22 are electrically interconnected by an outer circumferential conductor 30 connected with the outermost edges of each of the radially oriented stator plate segments 22. Similarly, the second stator plate 20 includes an inner circumferential conductor 32 for electrically connecting with the innermost edges of the second set of stator plate segments 28.

The inner and outer circumferential conductors 30 and 32 are each provided with a pair of radially aligned gaps 34 and 36. These radial gaps are equal, in circumferential extent, to an even multiple of the circumferential extent of the stator plate segment. Moreover, the individual plate segments making up both the first and second set are equal to each other in terms of circumferential extent and are spaced equally around the circumference of stator 2 outside of the gaps 34 and 36. The purpose for this precise arrangement will be understood more fully upon a discussion of the configuration and function of the rotor 3 set forth below. Positioned inwardly of first and second stator plates 20 and 26 is a third stator plate 38 having a generally circular inner stator plate section 40. Both stator 2 and inner stator plate section 40 may be provided with a central opening 42 for accommodating a shaft (not illustrated) whose rotation is to be sensed by the subject capacitive transducer. Third stator plate 38 is provided with a radial extension 44 connected at its innermost end with the circular inner stator plate section 40 and extending outwardly through the radially aligned gaps 34 and 36 to a position outside of the radial extent of the first and second stator plates 20 and 26.

FIG. 2 also discloses an array of electrical terminals positioned closely adjacent the location of gap 34. In particular, a first supply terminal 46, adapted to be connected with a first fixed voltage, is electrically connected with the stator plate segment 22 of the first stator plate 20 which lies adjacent to gap 34. Similarly, a second supply terminal 48, adapted to be connected with a second fixed voltage different from the first fixed voltage, is electrically connected to the stator plate segment 28 of the second set which lies adjacent the other side of gap 34. Positioned intermediate terminals 46 and 48 is an output signal terminal 50 electrically connected with radial extension 44 of the third stator plate 38.

Figure 3:
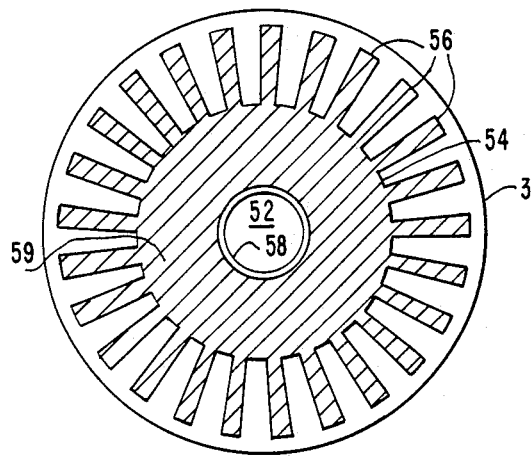
FIG. 3 is an elevational view of the plate mounted on the rotor of the transducer illustrated in FIG. 1.

Referring now to FIG. 3, an elevational view of the rotor 3 is shown as having a generally circular configuration having an outer radius approximately equal to the outer radius of the stator 2 shown in FIG. 2. On one face of rotor 3 perpendicular to the central axis 52 of the rotor 3 is mounted a rotor plate 54. As shown in FIG. 3, rotor plate 54 includes a plurality of electrically interconnected rotor plate segments 56 having a finger-like configuration and located in a spaced apart radial direction with respect to central axis 52 to form thereby a circumferential pattern similar to the stator plate segments 22 and 28. The circumferential extent of each segment 56 is equal to one another and to the circumferential extent of both the first set of stator plate segments 22 and 28 of the first and second sets.

The number of rotor plate segments 56 is determined by the number of such segments necessary to permit the segments 56 to be positioned equal angularly about the circumference of axis 52 such that the circumferential angular spacing is equivalent to the angular spacing of the stator plate segments in each of the first and second set of stator plate segments. By this arrangement, segments 56 will alternately axially align with the corresponding segments of the first and second set of stator plate segments when rotor 3 is positioned adjacent stator 2 and rotated about its central axis.

A specific mathematical relationship exists between the number of segments 56 and the number of segments in each of the first and second sets of stator plate segments. To understand this relationship, it must first be pointed out that gaps 34 and 36 are provided with a circumferential extent which is equal to an even multiple of the circumferential extent of a single stator plate segment. Therefore, the circumferential extent of gaps 34 and 36 may be equal to either two, four, six, etc. times the circumferential extent of a single stator plate segment. Because it is desired that the rotor plate segments 56 be capable of alternate axial alignment with the first and second sets of stator plate segments, it will be necessary for the number of rotor plate segments to be equal to the number of stator plate segments in each of the first or second set increased by a number equal to the even multiple of stator plate segments, which defines the circumferential extent of gaps 34 and 36, divided by the number 2.

Rotor plate 54 further includes a signal transfer section 59 having a generally circular configuration and located radially inwardly of the rotor plate segments 56. Section 59 is electrically connected with segment 56 and is positioned to capacitively couple with the inner stator plate section 40 of the third stator plate 38. A central opening 58 and corresponding opening in section 59, concentric with the central axis 52, may be provided to permit the rotor to be fixedly mounted on a shaft.

Figure 4:
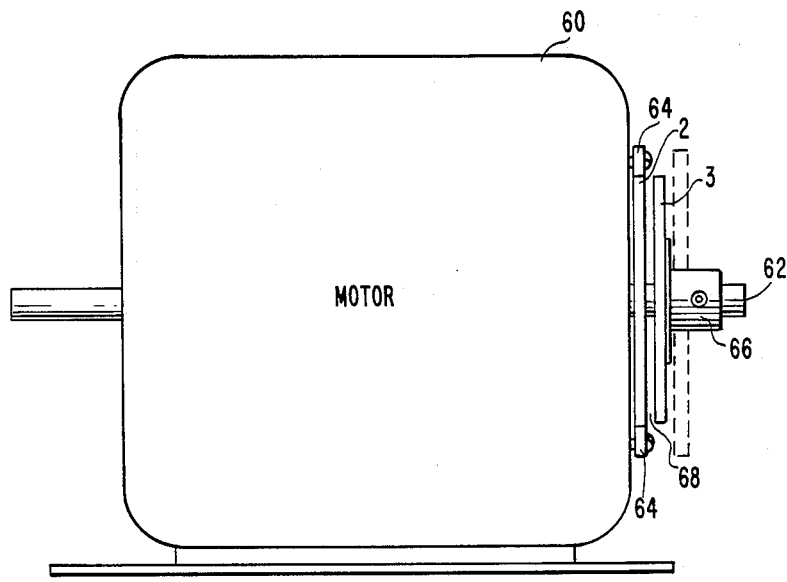
FIG. 4 is a side elevational view of a capacitive transducer designed in accordance with the subject invention as it would appear mounted on the shaft of a electrical motor.

Referring now to FIG. 4, the operation of the rotor and stator elements illustrated in FIGS. 2 and 3 can be better understood. In particular, FIG. 4 illustrates a side elevational view of the capacitive transducer of the subject invention wherein stator 2 has been mounted at one end of an electric motor casing 60 such that the output shaft of the motor 62 extends through central opening 42 of stator 2. Mounting elements 64 are used to secure stator 2 in a fixed position. Rotor 3 is mounted in a fixed relationship with shaft 62 for rotation therewith by a collar 66. The rotor and stator plates illustrated in FIGS. 2 and 3 are located on the opposed faces defining the small gap 68 between the rotor and stator. Because the pattern of segments 56 is both circumferentially and radially identical substantially to the pattern of segments forming each of the first and second sets of stator segments, segments 56 become successively alternately aligned with the segments making up the respective first and second sets of stator plate segments. Because gap 68 is sufficiently small, segments 56 become capacitively coupled alternately with the segments forming the first and second stator plates. The first and second stator plates are held at fixed but different voltage levels. This causes an alternating signal to be induced in segments 56 and signal transfer section 59 which in turn is capacitively coupled to inner stator plate section 40 illustrated in FIG. 2. It can be now seen that the unique shape and relative arrangement of conductor plates on the stator and rotor elements illustrated in FIGS. 2 and 3 allows a time varying signal to be produced on output terminal 50 related to the relative rotational movement between the rotor and stator elements. A second stator element 70 may be mounted adjacent rotor 3 having stator segments related 90° is out of phase with the stator segments of stator 2 in order to generate a second output signal indicative of the direction of rotation.

Figure 5:
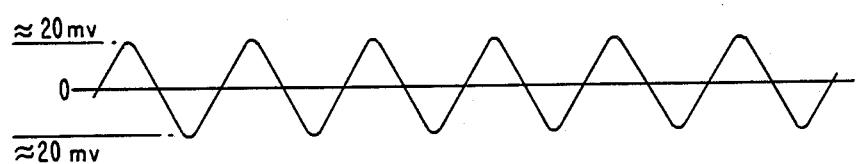
FIG. 5 is a graph showing a typical waveform of an output signal appearing on the output terminal of a capacitive transducer designed in accordance with the subject invention.

FIG. 5 illustrates a waveform representative of the type of time varying signal produced on output terminal 50 by the subject capacitive transducer. This waveform is generally sinusoidal in configuration with the peaks occurring upon precise alignment of segments 56 with either the first or second set of stator plate segments. The crossover points occur when rotor segments 56 are positioned precisely halfway between the stator segments making up the first and second sets. Because the entire set of capacitive segments is used (except for those axially aligned with radial extension 44), small irregularities in the form of the segments or angular inequalities in the positioning of the segments tend to be averaged out. Moreover, non-perpendicularity in the position of either the rotor or stator elements relative to the rotational axis of the shaft, whose rotation is being measured, also tend to be averaged out.

Figure 6:
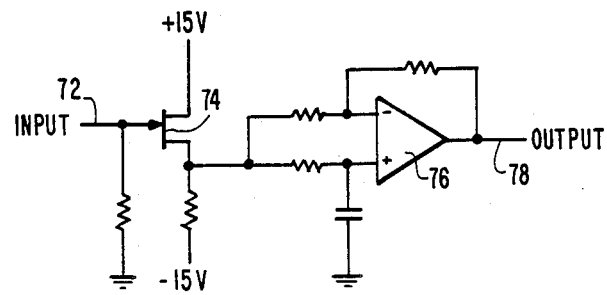
FIG. 6 is a square wave circuit responsive to the output signal whose waveform is illustrated in FIG. 5.
Figure 7:
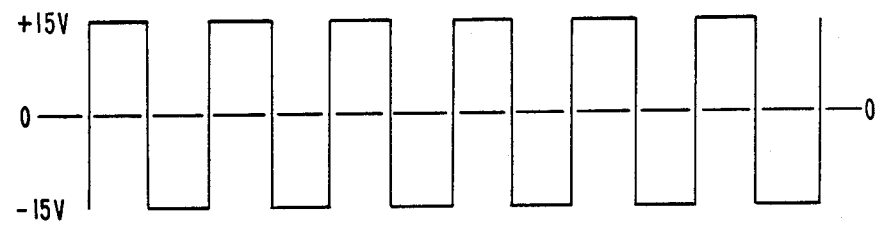
FIG. 7 is a graph of the waveform produced on the output of the square wave circuit illustrated in FIG. 6.

FIG. 6 is a schematic circuit diagram of a typical circuit which might be employed to form output circuit 18 illustrated in FIG. 1. In particular, the signal appearing at output terminal 50 may be applied to input 72 which in turn is coupled to transistor 74 for controlling the input to a differential amplifier 76 whose output 78 is designed to flip between a positive 15 volts and a negative 15 volts dependent upon whether the input voltage level is above or below a reference value formed by transistor 74. A typical electrical waveform appearing on output 78 appears in FIG. 7. The signal on output 78 may be further processed in a variety of ways to determine either position or rotational velocity/acceleration of the shaft.

Figure 8:
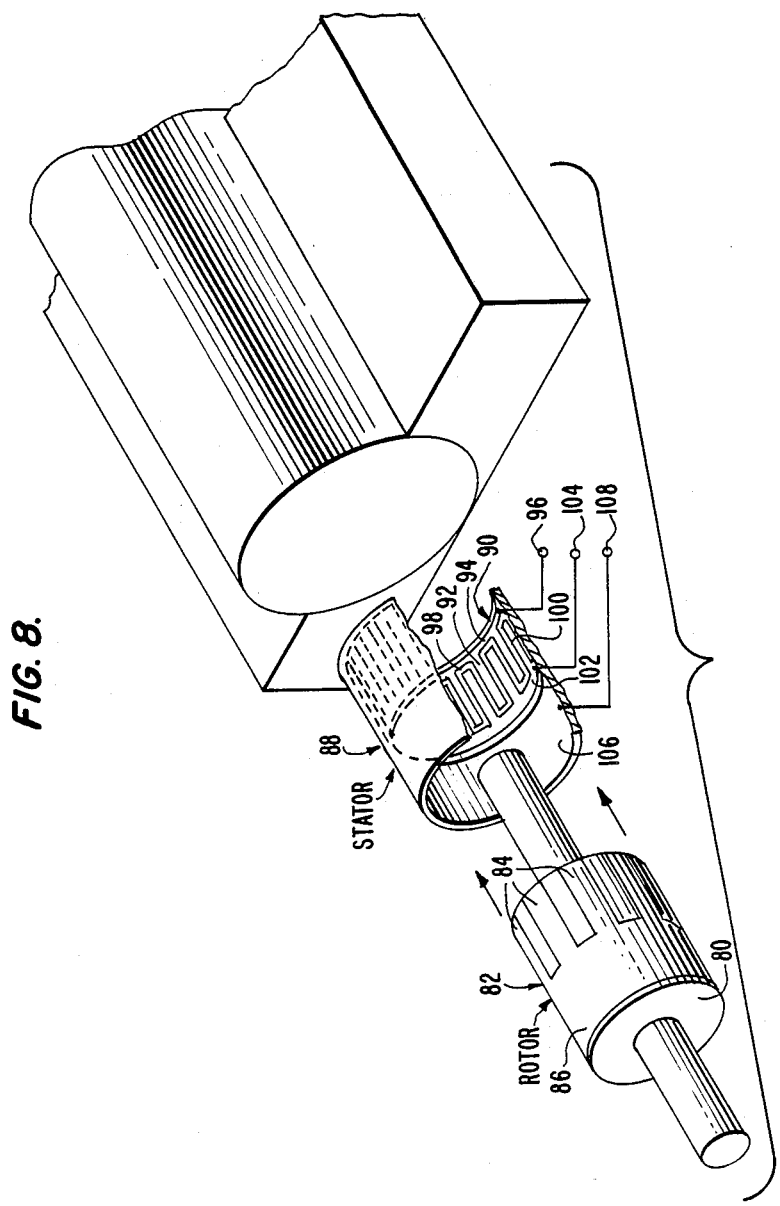
FIG. 8 is an exploded perspective view of another embodiment of a capacitive transducer designed in accordance with the subject invention wherein the stator has been partially cutaway to illustrate the first, second and third stator plates mounted thereon.

Turning now to FIG. 8, a second embodiment of the subject invention is disclosed wherein the stator and rotor elements are formed in a generally cylindrical configuration. In particular, a cylindrical rotor 80 may be provided upon the exterior surface of which is mounted a rotor plate 82 including a plurality of rotor plate segments 84 corresponding to rotor plate segments 56 of FIG. 3. However, instead of being arranged in a equal angular radial pattern, rotor plate segments 84 are arranged in an orientation parallel to the rotational axis of rotor 80 and are spaced equally around the circumferential surface of the rotor. Axially spaced from, but in contact with, one end of each of the rotor plate segments 84 is a signal transfer section 86.

FIG. 8 further shows a cylindrical stator 88, one portion of which has been cutaway to reveal first, second and third stator plates mounted on the interior surface thereof at a radial distance from the central axis of the stator to allow the rotor 80 to be placed within the interior of the cylindrical stator 88 and to position segments 84 and section 86 in capacitive coupling condition with corresponding plates mounted on the stator. In particular, a first stator plate 90 includes a plurality of stator plate segments 92 oriented in a direction generally parallel to the central axis of stator 88. The stator plate segments 92 make up a first set positioned equal angularly about the inside circumference of stator 88. The first set of segments is interconnected by a cylindrical conductor 94 which in turn is connected to a first supply voltage terminal 96. Similarly, a second stator plate 98 including a second set of stator plate segments 100 interleaved with stator plate segments 92 and electrically interconnected by a cylindrical conductor 102 is illustrated. A second supply voltage terminal 104 is connected with the second stator plate 98. A stator plate 104 is provided in an axially spaced position to permit capacitive coupling with signal transfer section 86 of rotor 80. Except for their cylindrical configuration, segments 84 alternately capacitively couple with the first and second set of stator plate segments 92 and 98, respectively, in the same manner as the plate segments of the rotor and stator illustrated in FIGS. 2 and 3. An output signal terminal 108 is electrically connected with the third stator plate 106 and is designed to transfer a time varying signal in the same manner as the output terminal 50 of FIG. 2.

Figure 9:
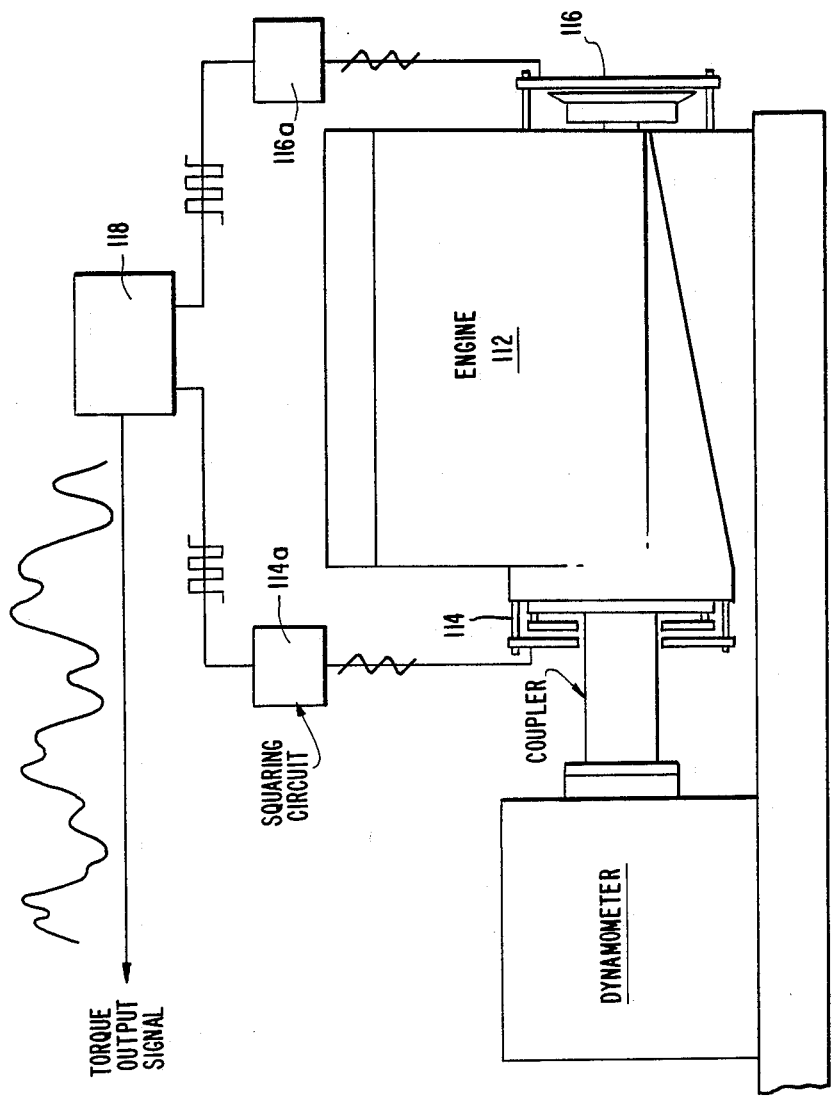
FIG. 9 is yet another embodiment of a capacitive transducer designed in accordance with the subject invention wherein a pair of such transducers has been mounted on opposite ends of an internal combustion engine crankshaft to produce two signals, the phase differences of which are indicative of the torque being transmitted by the crankshaft.
Figure 10A:
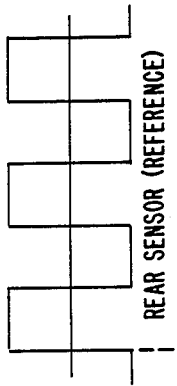
FIGS. 10a and 10b disclose identical waveforms produced by the rear sensor shown in FIG. 9.
Figure 10B:
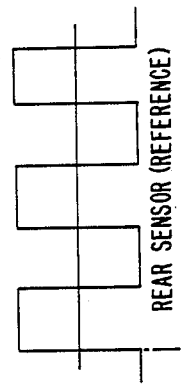
Figure 10C:
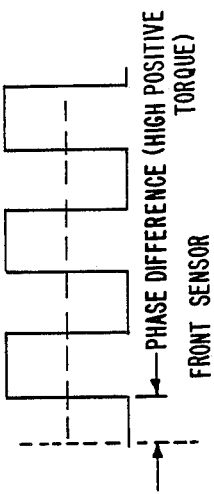
FIGS. 10c and 10d disclose the waveform produced by the front sensor under low positive torque and high positive torque conditions, respectively.
Figure 10D:
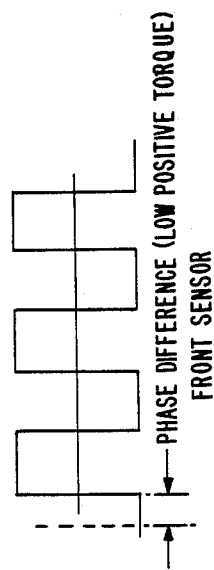
Figure 10E:
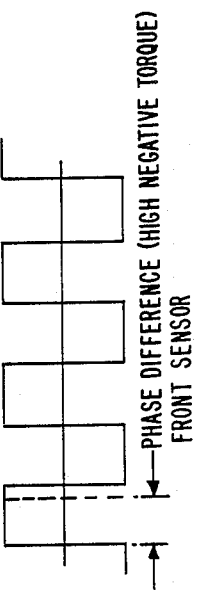
FIGS. 10e and 10f illustrate waveforms produced by the front sensor of FIG. 9 under low negative torque and high negative torque conditions, respectively.
Figure 10F:
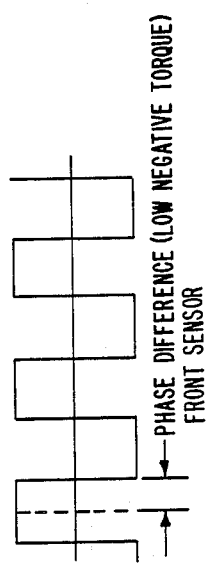

FIG. 9 shows yet another embodiment of the subject invention wherein a pair of capacitive transducers designed in accordance with the teachings of this invention have been mounted at opposite ends of a crankshaft 110 of an internal combustion engine 112. The rear capacitive transducer 114 may be used as a reference signal generator, the output from which may be provided to a squaring circuit 114a of the type illustrated in FIG. 6 to create a square wave output of the type illustrated in FIGS. 10a and 10b. The capacitive transducer 116 mounted on the front end of crankshaft 110 will produce a second signal which may be provided as an input to a second squaring circuit 116a. A comparator 118 operates to compare the phase difference between the signal produced by transducer 114 and transducer 116 to thereby measure both the magnitude and direction of the torque produced by the engine crankshaft. For example, FIG. 10c shows the squarewave output produced by transducer 116 during a low positive torque condition whereas FIG. 10e shows a squarewave signal produced by transducer 116 during a low negative torque condition. Similarly, FIGS. 10b and 10f show the output signal created during a high positive and a high negative torque condition, respectively. It has been discovered that one or both of the rotor and stator elements may be split to facilitate the installation around a shaft such as the crankshaft of an internal combustion engine. Is infact, the plates mounted on either the rotor or stator may be less than a full circumference.

INDUSTRIAL APPLICABILITY

The subject invention is capable of a vast array of applications in process controls, vehicular control, engine and power trains, as well as in the computer industry. For purposes of process controls, the disclosed capacitive transducer may be used to measure torque on any shaft transmitting power or to produce shaft balance information on any rotating shaft. Shaft vibration monitoring may also be achieved by means of the highly precise capacitive rotation transducer disclosed in this invention. Still more complex signal analysis can be used to produce cyclic speed variation signals indicative of small rotational rate changes within a single revolution. In the field of vehicular control, the subject invention could be used to determine both individual and differential wheel speeds. Such signals might be used in automatic braking systems, anti-skid sensing systems, dynamic wheel balancing device or synchronization sensing apparatus.

In the field of engine and power trains, the disclosed transducer will be capable of measuring the torque output of an internal combustion engine or the torque output of a typical aircraft turbine engine. Other uses include torque sensing for an automatic transmission or a drive line. The disclosed transducer may also operate as an end play sensor, an over torque sensor and a synchronization sensor for use on aircraft.

In the computer industry, capacitive transducers of the type disclosed in this invention would have a great many applications such as a precision rotation rate sensor for a tape drive or a transport control. The disclosed transducer could also serve as a low inertia sensor for a precision rotational rate control. It could also be used to calibrate or test equipment used for torque measurement. Still other uses will occur to persons of ordinary skill.

I claim:

1. A capacitive transducer for sensing shaft rotation, comprising
   (a) a stator adapted to be fixedly mounted adjacent to a shaft whose rotation is to be measured;

(b) a rotor adapted to be mounted on the shaft for rotation with the shaft in a position adjacent said stator; and (c) capacitive plate means for producing a signal indicative of shaft rotation using fixed voltage, direct current supplies coupled directly to said stator but without using brushes, commutators or slip rings, said capacitive plate means including (1) a first supply terminal mounted on said stator and adapted to be supplied with a first fixed voltage by being directly coupled to a first fixed voltage supply, (2) a second supply terminal mounted on said stator and adapted to be supplied with a second fixed voltage by being directly coupled to a second fixed voltage supply for supplying the second fixed voltage at a level different from said first fixed voltage, (3) an output signal terminal mounted on said stator, (4) a first electrically conductive stator plate mounted on said stator and electrically connected with said first supply terminal, said first stator plate having a first set of electrically interconnected stator plate segments located in a predetermined spaced apart pattern, (5) a second electrically conductive stator plate mounted on said stator and electrically connected with said second supply terminal, said second stator plate having a second set of electrically interconnected stator plate segments interleaved with and electrically isolated from said first set of electrically interconnected stator plate segments, (6) an electrically conductive rotor plate mounted on said rotor, said rotor plate having a plurality of electrically interconnected rotor plate segments located on said rotor in a spaced apart pattern which causes said rotor plate segments to be alternately capacitively coupled with said first and second sets of stator plate segments as said rotor is rotated, said rotor plate further having a signal transfer section electrically connected with said rotor plate segments, and (7) an electrically conductive third stator plate mounted on said stator and electrically connected with said output signal terminal, said third stator plate being positioned to be capacitively coupled to said signal transfer section of said rotor plate to cause a time variable signal indicative of shaft rotation to appear at said output signal terminal when said first and second voltages are supplied to said first and second supply terminals, respectively.

2. A capacitive transducer as defined in claim 1, wherein said stator and said rotor are disk-shaped and are adapted to be positioned in closely spaced apart, face to face condition perpendicular to the rotational axis of the shaft whose rotation is to be sensed, said stator plates and said rotor plate being mounted on the adjacent faces of said stator and said rotor, respectively, said first set of stator plate segments being arranged in a circumferentially spaced pattern wherein each said segment of said first set is arranged in a radial orientation with respect to the rotational axis of the shaft whose rotation is to be sensed and said second set of stator plate segments being similarly circumferentially spaced and interleaved with said first set of stator plates segments and wherein said third stator plate includes a generally circular inner stator plate section which is spaced radially inwardly from said first and second sets of stator plate segments.

3. A capacitive transducer as defined in claim 2, wherein said first, second and third stator plates are co-planar.

4. A capacitive transducer as defined in claim 2, wherein said rotor plate segments are positioned axially adjacent to said first and second set of stator plate segments, the number of said stator plate segments in said first and second set being equal.

5. A capacitive transducer for sensing shaft rotation, comprising (a) a stator adapted to be fixedly mounted adjacent to a shaft whose rotation is to be measured;

(b) a rotor adapted to be mounted on the shaft for rotation with the shaft in a position adjacent said stator; and (c) capacitive plate means for producing a signal indicative of shaft rotation using direct current but without using brushes, commutators or slip rings, said capacitive plate means including (1) a first supply terminal mounted on said stator and adapted to be supplied with a first fixed voltage, (2) a second supply terminal mounted on said stator and adapted to be supplied with a second fixed voltage different from said first fixed voltage, (3) an output signal terminal mounted on said stator, (4) a first stator plate mounted on said stator and electrically connected with said first supply terminal, said first stator plate having a first set of electrically interconnected stator plate segments located in a predetermined spaced apart pattern, (5) a second stator plate mounted on said stator and electrically connected with said second supply terminal, said second stator plate having a second set of electrically interconnected stator plate segments interleaved with and electrically isolated from said first set of electrically interconnected stator plate segments, (6) a rotor plate mounted on said rotor, said rotor plate having a plurality of electrically interconnected rotor plate segments located on said rotor in a spaced apart pattern which causes said rotor plate segments to be alternately capacitively coupled with said first and second sets of stator plate segments as said rotor is rotated, said rotor plate further having a signal transfer section electrically connected with said rotor plate segments, and (7) a third stator plate mounted on said stator and electrically connected with said output signal terminal, said third stator plate being positioned to be capacitively coupled to said signal transfer section of said rotor plate to cause a time variable signal indicative of shaft rotation to appear at said output signal terminal when said first and second voltages are supplied to said first and second terminals, respectively;

wherein said stator and said rotor are disk-shaped and are adapted to be positioned in closely spaced apart, face to face condition perpendicular to the rotational axis of the shaft whose rotation is to be sensed, said stator plates and said rotor plate being mounted on the adjacent faces of said stator and said rotor, respectively, said first set of stator plate segments being arranged in a circumferentially spaced pattern wherein each said segment of said first set is arranged in a radial orientation with respect to the rotational axis of the shaft whose rotation is to be sensed and said second set of stator plate segments being similarly circumferentially spaced and interleaved with said first set of stator plates segments and wherein said third stator plate includes a generally circular inner stator plate section which is spaced radially inwardly from said first and second sets of stator plate segments; wherein said rotor plate segments are positioned axially adjacent to said first and second set of stator plate segments, the number of said stator plate segments in said first and second set being equal; and wherein said first stator plate includes an outer circumferential conductor for electrically connecting with the outermost edges of said first set of stator plate segments and said second stator plate includes an inner circumferential conductor for electrically connecting with the innermost edges of said second set of stator plate segments, said inner and outer circumferential conductors having radially aligned gaps, said third stator plate includes a radial extension electrically connected at its innermost end with said circular inner stator plate section and extending outwardly through said radially aligned gaps.

6. A capacitive transducer as defined in claim 5, wherein said stator plate segments and said rotor plate segments are each of equal circumferential extent, said radially spaced gaps being equal in circumferential extent to an even multiple of said plate segments, said interleaved stator plate segments being equally spaced around the circumference of said stator outside of said radially aligned gaps, and wherein the number of said rotor plate segments equals the number of stator plate segments in said first set plus said even multiple divided by two.

7. A capacitive transducer as defined in claim 6, wherein said supply terminals and said output terminal are located adjacent said radially aligned gaps beyond the radial extent of said outer circumferential conductor, said first supply terminal being connected with a stator plate segment on one side of said radial extension of said third stator plate and said second supply terminal being connected with a stator plate segment on the other side of said radial extension of said third stator plate and further wherein said output terminal lies between said first and second supply terminal and is connected with said radial extension.

8. A capacitive transducer as defined in claim 6, wherein said signal transfer section of said rotor plate is circular and electrically connected with the innermost edges of said rotor plate segments, said circular signal transfer section being capacitively coupled with said circular inner stator plate section.

9. A capacitive transducer for sensing shaft rotation, comprising
(a) a stator adapted to be fixedly mounted adjacent to a shaft whose rotation is to be measured;
(b) a rotor adapted to be mounted on the shaft for rotation with the shaft in a position adjacent said stator; and
(c) capacitive plate means for producing a signal indicative of shaft rotation using direct current but without using brushes, commutators or slip rings, said capacitive plate means including (1) a first supply terminal mounted on said stator and adapted to be supplied with a first fixed voltage,
(2) a second supply terminal mounted on said stator and adapted to be supplied with a second fixed voltage different from said first fixed voltage,
(3) an output signal terminal mounted on said stator,
(4) a first stator plate mounted on said stator and electrically connected with said first supply terminal, said first stator plate having a first set of electrically interconnected stator plate segments located in a predetermined spaced apart pattern,
(5) a second stator plate mounted on said stator and electrically connected with said second supply terminal, said second stator plate having a second set of electrically interconnected stator plate segments interleaved with and electrically isolated from said first set of electrically interconnected stator plate segments,
(6) a rotor plate mounted on said rotor, said rotor plate having a plurality of electrically interconnected rotor plate segments located on said rotor in a spaced apart pattern which causes said rotor plate segments to be alternately capacitively coupled with said first and second sets of stator plate segments as said rotor is rotated, said rotor plate further having a signal transfer section electrically connected with said rotor plate segments, and
(7) a third stator plate mounted on said stator and electrically connected with said output signal terminal, said third stator plate being positioned to be capacitively coupled to said signal transfer section of said rotor plate to cause a time variable signal indicative of shaft rotation to appear at said output signal terminal when said first and second voltages are supplied to said first and second terminals, respectively;

wherein said stator and said rotor are cylindrically shaped and are adapted to be positioned in closely spaced apart condition co-axial with each other and with the axis of rotation of the shaft whose rotation is to be sensed, said stator plates and said rotor plates being mounted on the adjacent faces of said stator and said rotor, respectively, said first set of stator plate segments being arranged in a circumferentially spaced pattern wherein each said segment of said first set is arranged in parallel axial orientation with respect to the rotational axis of the shaft whose rotation is to be sensed, and said second set of stator plate segments being similarly circumferentially spaced and interleaved with said first set of stator plate segments, said third stator plate including a generally cylindrical stator plate section which is spaced axially from said first and second sets of stator plate segments.

10. A capacitive transducer as defined in claim 9, wherein said first, second and third stator plates lie within the same cylindrical surface.

11. A capacitive transducer as defined in claim 10, said rotor plate segments are positioned closely adjacent and radially inwardly of said first and second set of stator plate segments, the number of said stator plate segments in said first and second set being equal.

12. A capacitive transducer as defined in claim 11, wherein said first stator plate includes a first cylindrical conductor for electrically connecting with the ends of said first set of stator plate segments and said second stator plate includes a second cylindrical conductor for electrically connecting the ends of said second set of stator plate segments, said first and second conductors being located at opposite axial ends of said first and second stator plate segments.

13. A capacitive transducer as defined in claim 12, wherein said signal transfer section of said rotor plate is cylindrical in shape and is positioned closely adjacent to and radially inwardly of said third stator plate whereby said signal transfer section is capacitively coupled to said third stator plate.

14. A torque transducer for measuring the torque being transmitted by a shaft, comprising
   (a) a pair of stators adapted to be fixedly mounted adjacent opposite ends of the shaft;
   (b) a pair of rotors adapted to be mounted to opposite ends of the shaft for rotation therewith in a position adjacent said pair of stators, respectively;
   (c) a pair of capacitive plate means for producing a pair of signals indicative of the amount of torque being transmitted by the shaft using direct current excitation without using brushes, commutators or slip rings, each said capacitive plate means including
      (1) a first supply terminal mounted on each said stator and adapted to be supplied with a first fixed voltage,
      (2) a second supply terminal mounted on each said stator and adapted to be supplied with a second fixed voltage different from said first fixed voltage,
      (3) an output signal terminal mounted on each said stator,
      (4) a first stator plate mounted on each said stator and electrically connected with said first supply terminal, said first stator plate having a first set of electrically interconnected stator plate segments located in a predetermined spaced apart pattern,
      (5) a second stator plate mounted on each said stator and electrically connected with said second supply terminal, said second stator plate having a second set of electrically interconnected stator plate segments interleaved with and electrically isolated from said first set of electrically interconnected stator plate segments,
      (6) a rotor plate mounted on each said rotor, said rotor plate having a plurality of electrically interconnected rotor plate segments located in a spaced apart pattern which causes said rotor plate segments to be alternately capacitively coupled with said first and second sets of stator plate segments as said rotor is rotated, said rotor plate further having a signal transfer section electrically connected with said rotor plate segments, and
      (7) a third stator plate mounted on each said stator and electrically connected with said output signal terminal, said third stator plate being positioned to be capacitively coupled to said signal transfer section of said rotor plate to cause a time variable signal indicative of shaft rotation to appear at said output signal terminal when said first and second voltages are supplied to said first and second supply terminals, respectively; and
   (d) signal processing means for receiving said pair of signals and for comparing the phase differences therein to produce an output signal indicative of the magnitude of the phase difference.

* * * * *